United States Patent
Zambrano

(10) Patent No.: US 6,867,113 B1
(45) Date of Patent: Mar. 15, 2005

(54) IN-SITU DEPOSITION AND DOPING PROCESS FOR POLYCRYSTALLINE SILICON LAYERS AND THE RESULTING DEVICE

(75) Inventor: Raffaele Zambrano, Viagrande (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/191,743

(22) Filed: Nov. 13, 1998

(30) Foreign Application Priority Data

Nov. 14, 1997 (EP) .......................................... 97830603

(51) Int. Cl.$^7$ .......................... H01L 21/20; H01L 21/36
(52) U.S. Cl. ...................... 438/491; 438/532; 438/564; 438/592
(58) Field of Search ............................ 438/491, 532, 438/564, 592, FOR 193, FOR 257, FOR 269, FOR 393

(56) References Cited

U.S. PATENT DOCUMENTS

| | | | |
|---|---|---|---|
| 4,074,300 A | * 2/1978 | Sakai et al. .................. 257/387 |
| 4,354,309 A | * 10/1982 | Gardiner et al. ............ 257/412 |
| 4,441,249 A | * 4/1984 | Alspector et al. |
| 4,663,645 A | 5/1987 | Komori et al. |
| 4,663,825 A | * 5/1987 | Maeda .............. 148/DIG. 140 |
| 4,977,104 A | 12/1990 | Sawada et al. |
| 5,141,892 A | * 8/1992 | Beinglass |
| 5,547,890 A | * 8/1996 | Tseng |
| 5,646,061 A | * 7/1997 | Wang et al. |
| 5,652,156 A | * 7/1997 | Liao et al. ......... 148/DIG. 122 |
| 5,849,629 A | * 12/1998 | Stamper et al. |
| 5,943,569 A | * 8/1999 | Shih et al. .................. 438/253 |
| 6,060,360 A | * 5/2000 | Lin et al. ..................... 438/264 |
| 6,274,401 B1 | * 8/2001 | Hamasaki .................... 438/530 |

FOREIGN PATENT DOCUMENTS

| | | |
|---|---|---|
| EP | 04/67190 | 1/1992 |
| EP | 0639856 A1 * | 2/1995 |
| EP | 07/72231 | 5/1997 |
| GB | 2171844 A * | 9/1986 |
| GB | 2251132 | 6/1992 |
| JP | 2202018 A * | 8/1990 |

OTHER PUBLICATIONS

European Search Report (Jun. 25, 1998).

* cited by examiner

Primary Examiner—George Fourson
Assistant Examiner—Michelle Estrada
(74) Attorney, Agent, or Firm—Lisa K. Jorgenson; Stephen Bongini; Fleit, Kain, Gibbons, Gutman, Bongini & Bianco P.L.

(57) ABSTRACT

An in-situ deposition and doping method for polycrystalline silicon layers of semiconductor devices. A first intermediate layer of in-situ doped polycrystalline silicon is grown, and a second additional layer of polycrystalline silicon is grown with a lower doping level than that of the first intermediate layer of polycrystalline silicon. In one preferred method, the second doping level is substantially lower than the first doping level. Additionally, a semiconductor memory device of the type having a gate stack is provided. The memory device includes at least one gate layer of polycrystalline silicon, and the gate layer of polycrystalline silicon is formed from a first intermediate layer of polycrystalline silicon with a first doping level, and an overlaying second additional layer of polycrystalline silicon with a second doping level that is lower than the first doping level. In a preferred embodiment, the second doping level is substantially lower than the first doping level.

17 Claims, 1 Drawing Sheet

IN-SITU DEPOSITION AND DOPING PROCESS FOR POLYCRYSTALLINE SILICON LAYERS AND THE RESULTING DEVICE

CROSS-REFERENCE TO RELATED APPLICATIONS

This application is based upon and claims priority from prior European Patent Application No. 97-830603.3, filed Nov. 14, 1997.

BACKGROUND OF THE INVENTION

1. Field of the Invention

The present invention relates to semiconductor devices, and more specifically to an in-situ deposition and doping process for polycrystalline silicon layers of semiconductor devices.

2. Description of Related Art

Polycrystalline silicon, which is also known as polysilicon or polySi, is an essential material for integrated circuits such as MOS-type circuits because polysilicon can be doped at levels that make it a substantially degenerate semiconductor or metal-like with respect to electric conduction. During manufacturing, polysilicon is usually grown from $SiO_2$ layers so that the resulting material is formed of crystals that are smaller than one micrometer. These small polysilicon crystals are also known as grains. One exemplary application of polysilicon is in the structures of flash-type memory devices.

FIG. 1 shows the structure of a flash memory device during an intermediate processing stage following gate stack definition (i.e., after forming the gate layers and before the re-oxidation process). The gate stack includes a first layer P1 of $n^+$ type polysilicon (e.g., a layer consistently doped at $10^{20}$ atoms/cm$^3$) that is deposited over a thin layer of tunnel oxide OT, and a dielectric formed by a sequence of oxide layers OX, such as $SiO_2$, $SiN_4$ and $SiO_2$ again (i.e., ONO), is deposited on the first polysilicon layer P1. On the dielectric layer OX, a second $n^+$ type polysilicon layer P2 is deposited, and then a silicide layer W (e.g., $WSi_2$ or $TiSi_2$) is deposited as required to reduce the series resistance of the gate. The source S and drain D areas of the memory cell, which are located on the sides of the gate stack, are simultaneously diffused during a subsequent re-oxidation process in which a thin $SiO_2$ layer is grown on the sides of the gate stack.

To form the polysilicon gate layers, the current trend is towards using an in-situ doping technique in which a polysilicon layer is both grown and doped at the same time (e.g., by directly introducing phosphorous in the form of phosphine $PH_3$ into the growth mixture). Such in-situ doping is preferred because liquid phase doping from $POCl_3$ is intrinsically "dirty." In particular, liquid phase doping generates many spurious particles and thus produces a highly defective polysilicon layer. Further, the ionic implantation technique cannot reach the same high doping values and requires extensive use of implantation machines that produce a much finer layer grain that is not always desirable, especially in volatile memory devices.

The problems related to in-situ polysilicon doping are essentially derived from the high doping level to be reached and the considerable grain size. First, in a segregation phenomenon that occurs along the grain edges, the dopant atoms tend to exploit the unsaturated bonds and locate over the microcrystal external surface. The segregation phenomenon can cause excessive localized accumulations of dopant and even some grains to come off the layer so as to cause the layer itself to be defective. Further, in an "out-doping" phenomenon that occurs during the re-oxidation thermal treatment, the high processing temperature causes the polysilicon deposited on the backside of the wafer to release some dopant and contaminate the oxidating gaseous atmosphere so as to extend to the open areas in the front. This can considerably alter the doping of both the active and insulating areas of the device.

One proposed solution to such problems is to use a re-oxidation process in which an oxide layer is deposited over the doped polysilicon after its first growth stage in order to provide a barrier to p-type atom diffusion. However, using such a re-oxidation process has other drawbacks such as an increase in crystallographic defects because the growth of the oxide layer takes place before carrying out an 'annealing' treatment of the defects generated during the implantation stage, and a reduced adhesion of the silicide layer to the underlying polysilicon layer. Another proposed solution is to remove a portion of the doped polysilicon from the backside of the wafer before re-oxidation. However, such a technique increases manufacturing costs and generates further defects.

SUMMARY OF THE INVENTION

In view of these drawbacks, it is an object of the present invention to remove the above-mentioned drawbacks and to provide a more efficient and improved in-situ deposition and doping process for polycrystalline silicon layers. First, a first intermediate layer of in-situ doped polycrystalline silicon is grown with a determined doping level, and then a second additional layer of polycrystalline silicon is grown with a lower doping level than that of the first intermediate layer.

Another object of the present invention is to provide an in-situ deposition and doping process for polycrystalline silicon layers that prevents the dopant from reaching the surface during subsequent thermal treatments.

A further object of the present invention is to provide an in-situ deposition and doping process for polycrystalline silicon layers that does not introduce additional defects.

Still another object of the present invention is to provide an in-situ deposition and doping process for polycrystalline silicon layers that ensures a good degree of adhesion of the silicide layers to the polycrystalline silicon.

Yet another object of the present invention is to provide an in-situ deposition and doping process for polycrystalline silicon layers that does not require the subsequent removal of a portion of the deposited polycrystalline silicon.

One embodiment of the present invention provides an in-situ deposition and doping method for polycrystalline silicon layers of semiconductor devices. A first intermediate layer of in-situ doped polycrystalline silicon is grown, and a second additional layer of polycrystalline silicon is grown with a lower doping level than that of the first intermediate layer of polycrystalline silicon. In one preferred method, the second doping level is substantially lower than the first doping level.

Another embodiment of the present invention provides a semiconductor memory device of the type having a gate stack. The semiconductor memory device includes at least one gate layer of polycrystalline silicon, and the gate layer of polycrystalline silicon is formed from a first intermediate layer of polycrystalline silicon with a first doping level, and an overlaying second additional layer of polycrystalline silicon with a second doping level that is lower than the first doping level. In a preferred embodiment, the second doping level is substantially lower than the first doping level.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
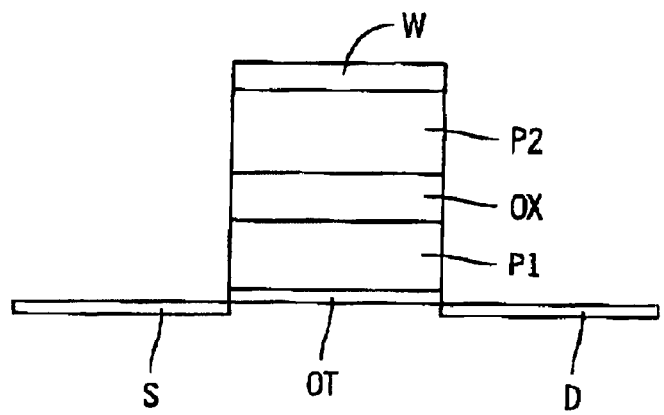
FIG. 1 is a block diagram showing the structure of a conventional flash memory device during an intermediate processing stage.
Figure 2A:
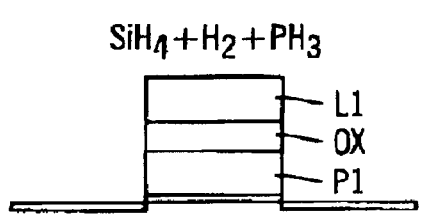
FIG. 2a is a block diagram showing a first step of an in-situ deposition and doping process according to a preferred embodiment of the present invention.

FIG. 2a shows a first step of an in-situ deposition and doping process according to a preferred embodiment of the present invention. As shown, the in-situ process is used for the polysilicon layer that corresponds to the second polysilicon layer P2 of the flash memory device of FIG. 1 (i.e., the layer on which the silicide layer W is deposited). During the first step of FIG. 2a, a first intermediate polysilicon layer L1 of the device is deposited using a gaseous mixture of $SiH_4+H_2+PH_3$ and an LPCVD (Low Pressure Chemical Vapor Deposition) apparatus. Preferably, the deposition temperature is about 650° C. and the deposition time is set so as to obtain an intermediate layer L1 that is about 120 nanometers thick.

Figure 2B:
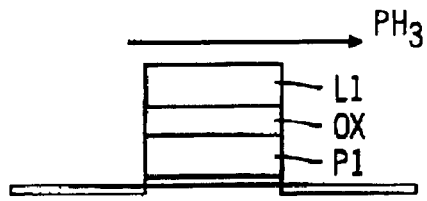
FIG. 2b is a block diagram showing a second step of the in-situ deposition and doping process of the preferred embodiment.

A second step of the in-situ deposition and doping process is shown in FIG. 2b. During this step, the flow of the $SiH_4+H_2+PH_3$ gaseous mixture inside the deposition chamber is interrupted to purge the chamber. More specifically, during the deposition process, the gaseous mixture is flowed through the deposition chamber using inlet and outlet pumps. In this purging step, the gas flow into the chamber is stopped so the residual gas is pumped out of the chamber. This removes all of the available dopant in order to avoid contamination during the subsequent deposition of an additional layer L2.

Figure 2C:
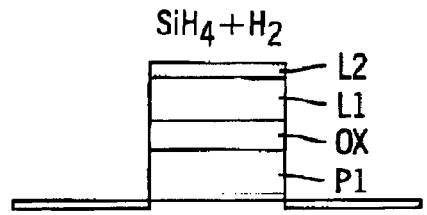
FIG. 2c is a block diagram showing a third step of the in-situ deposition and doping process of the preferred embodiment.

FIG. 2c shows a third step of the in-situ deposition and doping process in which a non-doped polysilicon is deposited. In this context, non-doped polysilicon includes a polysilicon layer having a doping atom concentration that is considerably lower than that of a "doped" polysilicon layer. A gaseous mixture of $SiH_4+H_2$ is used, and the deposition time is set so as to obtain a second additional non-doped polysilicon layer L2 that is about 15 nanometer thick. The thickness of the second additional polysilicon layer L2 is determined such that the average doping level resulting from the summation of the first intermediate polysilicon layer L1 and the second additional polysilicon layer L2 does not significantly change when redistribution of doping atoms between layers takes place (as explained below). Preferably, a 10:1 ratio is maintained between the thickness of the first intermediate doped polysilicon layer L1 and the thickness of the second additional non-doped polysilicon layer L2.

Figure 2D:
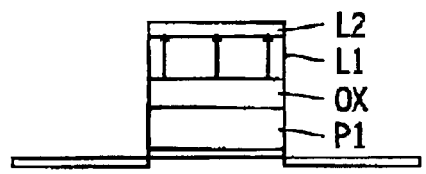
FIG. 2d is a block diagram showing a fourth step of the in-situ deposition and doping process of the preferred embodiment.

A fourth step of the in-situ deposition and doping process is shown in FIG. 2d. In this re-oxidation step, the dopant contained in the first intermediate doped polysilicon layer L1 is diffused into the second additional layer of non-doped polysilicon L2 through thermal diffusion. Because of the dopant diffusion, the doping levels of the first intermediate polysilicon layer L1 and the second additional polysilicon layer L2 appear substantially equal at the end of the fourth re-oxidation step.

As explained above, the in-situ deposition and doping process of the present invention is advantageously divided in two parts: a first stage that is identical to the doped polysilicon deposition stage of conventional in-situ deposition processes, and a subsequent second stage in which non-doped polysilicon or a significantly less doped polysilicon (as compared with the doped polysilicon deposited in the first stage) is deposited. The layer deposited in the second stage acts as a barrier against the out-doping phenomenon during the re-oxidation process, without any need for providing oxide barriers.

Furthermore, because an oxide is not required, crystallographic defects induced by the process will be reduced because the first stage of the subsequent re-oxidation process may not be an oxidating process and allows annealing of defects generated during the previous implantation stages. It is also beneficial to have no recourse to oxidation for a better adhesion of silicide on the upper layer of polysilicon. Additionally, the need to remove a portion of the deposited polysilicon from the backside of the wafer is advantageously avoided. To control the total layer thickness, it is simply necessary to take into account the sum of the thicknesses of the two polysilicon layers that are deposited.

While a specific in-situ deposition and doping process for polycrystalline silicon layers is described in detail above, the illustrated process merely serves as an example of the application of the principles of the present invention. The present invention is not meant to be limited to only the illustrated process. In further embodiments, the shape and size of the above-described components may be different. Further, the components may be replaced with equivalent components. For example, different thickness ratios are possible between the first intermediate layer and the second additional layer as long as the desired average doping level is obtained at the end of the process. Similarly, when deposition takes place, the second additional polysilicon layer can be substantially free from doping atoms or can have a dopant concentration that is substantially lower (e.g., $10^{17}$ atoms/cm$^3$) than that of the first intermediate layer.

Additionally, deposition of the layers can be performed using any technique that is apt to produce a polysilicon with electronic properties suitable for integrated circuits and in-situ doping, including any vapor-phase deposition technique. Furthermore, while the above description relates to a process for forming a flash-type memory device in which two polysilicon layers with different functions are provided, the in-situ process of the present invention can also be used for forming devices having a single polysilicon layer such as CMOS logic devices, power discrete circuits (e.g., VDMOS-FETs and IGBTs), and power integrated circuits. Likewise, the in-situ process of the present invention is applicable to any semiconductor device that requires a heavy $n^+$ type doping of polysilicon layers without presenting the problems related to the use of conventional in-situ techniques.

The in-situ process of the present invention is also applicable to the deposition of p-type polycrystalline silicon layers.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. An in-situ deposition and doping method for a polycrystalline silicon layer of a semiconductor device, said method comprising the steps of:

growing, in a deposition chamber, a first intermediate layer of in-situ doped polycrystalline silicon with a first thickness and a first doping level;

after growing the first intermediate layer, purging the deposition chamber by stopping all gas flow into the chamber and pumping residual gas out of the chamber, so as to remove all available dopant; and after purging the deposition chamber, growing a second additional layer of polycrystalline silicon with a second thickness and a second doping level that is lower than the first doping level, wherein the first thickness is greater than the second thickness.

2. The in-situ deposition and doping method as defined in claim 1, wherein the second doping level is substantially lower than the first doping level.

3. The in-situ deposition and doping method as defined in claim 1, wherein the first intermediate layer and the second additional layer are of the same conductivity type.

4. The in-situ deposition and doping method as defined in claim 1, wherein both the first intermediate layer and the second additional layer have n-type conductivity.

5. The in-situ deposition and doping method as defined in claim 1, wherein in the step of growing a first intermediate layer, a layer of polycrystalline silicon is produced with a thickness that is substantially at a 10:1 ratio with the thickness of the layer of polycrystalline silicon produced in the step of growing a second additional layer.

6. The in-situ deposition and doping method as defined in claim 1, further comprising the step of:

performing a subsequent thermal treatment to diffuse dopant from the first intermediate layer to the second additional layer, wherein the average doping level of the first intermediate layer after the thermal treatment is at least about $1 \times 10^{19}$ atoms/cm$^3$.

7. The in-situ deposition and doping method as defined in claim 1, wherein the step of growing a first intermediate layer is performed through an LPCVD process using a mixture of silane, hydrogen, and phosphine.

8. The in-situ deposition and doping method as defined in claim 7, wherein the step of growing a second additional layer is performed through an LPCVD process using a mixture of silane and hydrogen.

9. The in-situ deposition and doping method as defined in claim 1, wherein the second additional layer is substantially not doped.

10. The in-situ deposition and doping method as defined in claim 9, further comprising the step of:

performing a subsequent thermal treatment to diffuse dopant from the first intermediate layer to the second additional layer, wherein the average doping level of the first intermediate layer after the thermal treatment is at least about $1 \times 10^{19}$ atoms/cm$^3$.

11. The in-situ deposition and doping method as defined in claim 9, further comprising the step of:

performing a subsequent re-oxidation treatment to diffuse dopant from the first intermediate layer to the second additional layer, wherein the average doping level of the first intermediate layer after the re-oxidation treatment is at least about $1 \times 10^{19}$ atoms/cm$^3$.

12. The in-situ deposition and doping method as defined in claim 11, wherein the step of performing a subsequent re-oxidation treatment includes the sub-steps of:

performing a first thermal treatment in a non-oxidating environment to anneal generated defects; and performing an oxidation treatment.

13. The in-situ deposition and doping method as defined in claim 9, wherein the step of growing a first intermediate layer is performed through an LPCVD;

process using a mixture of silane, hydrogen, and phosphine, and the step of growing a second additional layer is performed through an LPCVD process using a mixture of silane and hydrogen.

14. An in-situ deposition and doping method for a polycrystalline silicon layer of a semiconductor device, said method comprising the steps of:

growing, in a deposition chamber, a first intermediate layer of in-situ doped polycrystalline silicon with a first thickness and a first doping level;

after growing the first intermediate layer, purging the deposition chamber by stopping all gas flow into the chamber and pumping residual gas out of the chamber, so as to remove all available dopant;

after purging the deposition chamber, growing a second additional layer of polycrystalline silicon with a second thickness; and performing a re-oxidation thermal treatment to diffuse dopant from the first intermediate layer to the second additional layer, wherein the second additional layer is substantially not doped, and the first thickness is greater than the second thickness.

15. The in-situ deposition and doping method as defined in claim 14, wherein the step of performing a re-oxidation thermal treatment includes the sub-steps of:

performing a first thermal treatment in a non-oxidating environment to anneal defects; and performing an oxidation treatment.

16. The in-situ deposition and doping method as defined in claim 1, wherein the polycrystalline silicon layer of the semiconductor device consists of only the first intermediate layer and the overlying thinner second additional layer that provides a barrier during any subsequent thermal treatment.

17. The in-situ deposition and doping method as defined in claim 1, wherein in the step of growing the second additional layer of polycrystalline silicon, the second additional layer of polycrystalline silicon is grown on the first intermediate layer of in-situ doped polycrystalline silicon.

* * * * *